(12) United States Patent
Coffy et al.

(10) Patent No.: US 8,928,148 B2
(45) Date of Patent: Jan. 6, 2015

(54) SEMICONDUCTOR COMPONENT AND DEVICE PROVIDED WITH HEAT DISSIPATION MEANS

(75) Inventors: Romain Coffy, Saint Martin le Vinoux (FR); Yann Guillou, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 307 days.

(21) Appl. No.: 13/229,924

(22) Filed: Sep. 12, 2011

(65) Prior Publication Data

US 2012/0061849 A1    Mar. 15, 2012

(30) Foreign Application Priority Data

Sep. 13, 2010 (FR) ..................... 10 57255

(51) Int. Cl.
*H01L 29/72* (2006.01)
*H01L 25/10* (2006.01)
(Continued)

(52) U.S. Cl.
CPC .......... *H01L 25/105* (2013.01); *H01L 23/3128* (2013.01); *H01L 23/3135* (2013.01);
(Continued)

(58) Field of Classification Search
USPC .............. 257/734, 774, E23.01, E23.011
See application file for complete search history.

(56) References Cited

U.S. PATENT DOCUMENTS 6,532,152 B1 * 3/2003 White et al. .................. 361/692
2008/0157300 A1    7/2008 Chuang et al.
(Continued)

OTHER PUBLICATIONS

French Search Report and Written Opinion mailed Jan. 25, 2011 for FR 1057255 (11 pages).

*Primary Examiner* — Edward Wojciechowicz
(74) *Attorney, Agent, or Firm* — Gardere Wynne Sewell LLP

(57) ABSTRACT

A first component includes a slice formed from an integrated circuit chip having a front face and a rear face. An encapsulation block encapsulates the integrated circuit chip such that front and rear faces of the chip and front and rear faces of the encapsulation block are co-planar to form front and rear faces of the slice. Front and rear electrical connection networks are provided on the front and rear faces, respectively, with the electrical connection networks linked by electrical connection vias passing through the encapsulation block. A thermal transfer layer at least partially covers the rear face. A second component may be behind and at a distance from the first component. Connection elements interposed between the first component and the second component include both thermal connection elements in contact with the thermal transfer layer and electrical connection elements interconnecting the first and second components.

19 Claims, 2 Drawing Sheets

(51) Int. Cl.
   H01L 23/31    (2006.01)
   H01L 23/538   (2006.01)
   H01L 23/36    (2006.01)
   H01L 23/498   (2006.01)
   H01L 23/00    (2006.01)
   H01L 23/42    (2006.01)
   H01L 25/065   (2006.01)

(52) U.S. Cl.
   CPC ........... H01L 23/5389 (2013.01); H01L 23/36 (2013.01); H01L 23/49827 (2013.01); H01L 24/14 (2013.01); H01L 24/19 (2013.01); H01L 24/20 (2013.01); H01L 24/73 (2013.01); H01L 23/42 (2013.01); H01L 25/0657 (2013.01); H01L 2224/2518 (2013.01); H01L 2224/31245 (2013.01); H01L 2224/48091 (2013.01); H01L 2224/48227 (2013.01); H01L 2224/73253 (2013.01); H01L 2924/15311 (2013.01); H01L 24/48 (2013.01); H01L 2224/14519 (2013.01); H01L 24/13 (2013.01); H01L 24/29 (2013.01); H01L 24/32 (2013.01); H01L 2224/02377 (2013.01); H01L 2224/04042 (2013.01); H01L 2224/04105 (2013.01); H01L 2224/05548 (2013.01); H01L 2224/12105 (2013.01); H01L 2224/13022 (2013.01); H01L 2224/2919 (2013.01); H01L 2224/32225 (2013.01); H01L 2224/73215 (2013.01); H01L 2224/73265 (2013.01); H01L 2224/73267 (2013.01); H01L 2225/0651 (2013.01); H01L 2225/1035 (2013.01); H01L 2225/1058 (2013.01); H01L 2225/1094 (2013.01); H01L 2924/157 (2013.01); H01L 2924/1815 (2013.01); H01L 2225/06568 (2013.01)
   USPC  257/774; 257/773; 257/E23.01; 257/E23.011

(56) References Cited

U.S. PATENT DOCUMENTS

2009/0170241 A1* 7/2009 Shim et al. .................. 438/107
2012/0156830 A1* 6/2012 Lachner et al. ............. 438/113

* cited by examiner

SEMICONDUCTOR COMPONENT AND DEVICE PROVIDED WITH HEAT DISSIPATION MEANS

PRIORITY CLAIM

The present application claims priority from French Application for Patent No. 1057255 filed Sep. 13, 2010, the disclosure of which is hereby incorporated by reference.

TECHNICAL FIELD

The present invention relates to the field of semiconductor devices.

BACKGROUND

In the known semiconductor devices that comprise components provided with integrated circuit chips and stacked at a distance via electrical connection balls, there is a difficulty regarding the dissipation of heat, notably when the devices comprise a first component that includes a first heat-generating chip and a second component that includes a second chip which may also be heat generating and when the first component is mounted on a printed circuit wafer. The heat produced is in fact essentially evacuated towards the printed circuit wafer via the electrical connection balls of the first component on this wafer.

SUMMARY

There is first proposed a semiconductor component which comprises a slice comprising at least one integrated circuit chip that has a front electrical connection face and a rear face and an encapsulation block in which the integrated circuit chip is peripherally embedded, such that the front and rear faces of the chip and of the encapsulation block respectively form front and rear faces of the slice, and which comprises a front electrical connection network and a rear electrical connection network linked by electrical connection vias extending through said encapsulation block.

It is proposed that the component comprise a thermal transfer layer at least covering the rear face of the chip, this thermal transfer layer being intended for a dissipation of the heat via the rear of the component.

The component may comprise rear connection elements of which some are placed on the thermal transfer layer and others are linked to the rear electrical connection network.

The component may comprise front connection elements of which some are linked to the front electrical connection network and others, not linked to this network, are placed in front of the chip.

The rear electrical connection network and the thermal transfer layer may extend in the same metallic level.

There is also proposed a semiconductor device, which comprises a first component and a second component situated behind and at a distance from the first component.

The first component may comprise a slice comprising at least one integrated circuit chip that has a front electrical connection face and a rear face and an encapsulation block in which the integrated circuit chip is peripherally embedded, such that the front and rear faces of the chip and of the encapsulation block form the front and rear faces of the slice, the first component comprising a metallic thermal transfer layer at least partially covering the rear face of the chip.

A plurality of connection elements may be interposed between the first component and the second component, including first thermal connection elements in contact with the metallic thermal transfer layer of the first component and second electrical connection elements between the components.

The first component may comprise a front electrical connection network and a rear electrical connection network linked by connection vias extending through the encapsulation block of the first component and in which the second component comprises a front electrical connection network linked to the rear electrical connection network of the first component via said second connection elements.

The second component may comprise at least one integrated circuit chip and thermal connection vias between the first thermal connection elements and this chip.

The second component may comprise at least one integrated circuit chip of which a rear face is at least partially covered by a metallic rear layer.

The second component may be equipped with an external thermal block made of a thermal conducting foam extending at least partially over said metallic rear layer.

The external thermal block may extend over the rear face of the second component and may have a part which extends laterally to this second component.

The lateral part of the external thermal block may at least partially cover a peripheral part of the rear face of the first component.

Said peripheral part may comprise metallic portions of the front electrical connection network and/or lateral extensions of the thermal transfer layer of the first component.

There is also proposed a telephone which includes a semiconductor component of the above type or a semiconductor device of the above type, in which said thermal transfer layer may be thermally linked to a wall of this telephone by a thermal block made of a thermal conducting foam.

BRIEF DESCRIPTION OF THE DRAWINGS

Semiconductor devices will now be described by way of nonlimiting examples, illustrated by the drawing in which.

DETAILED DESCRIPTION OF THE DRAWINGS

Figure 1:
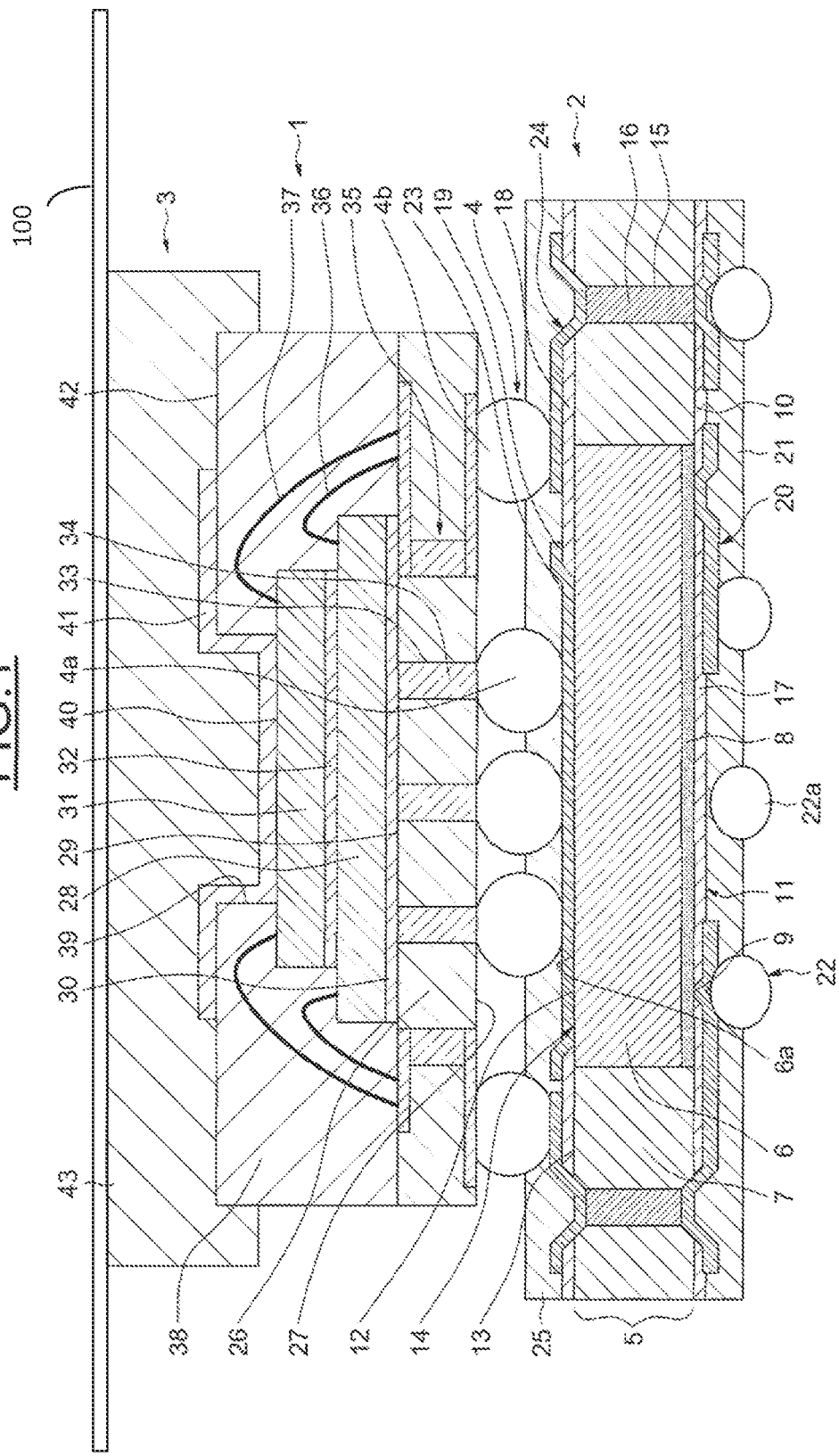
FIG. 1 represents a cross section of a semiconductor device.

Referring to FIG. 1, a semiconductor device 1 can be seen that comprises a first component 2 and a second component 3 placed one above the other, between which is placed a plurality of metallic connection elements 4, for example in the form of metal balls, at a distance from one another, the second component 3 being situated behind (above) and at a distance from the first component 2.

The first component 2 comprises a slice 5, reconstructed, which comprises an integrated circuit chip 6 and a dielectric encapsulation block 7 extending around the chip 6 and in which the chip 6 is peripherally embedded, such that a front face 8 of the chip 6, provided with electrical bonding pads 9, and a front face 10 of the encapsulation block 7 are co-planar to form a front face 11 of the slice 5 and a rear face 12 of the chip 6 and a rear face 13 of the encapsulation block 7 are co-planar to form a rear face 14 of the slice 5, the front and rear faces 8 and 12 of the chip 6 consequently not being covered by the encapsulation block 7.

Around and at a distance from the chip 6, the encapsulation block 7 has through holes 15 filled with a metallic material forming electrical connection vias 16 from one face to the other.

On the front and rear faces 11 and 14 of the slice 5, front and rear dielectric layers 17 and 18 are formed. The rear layer 18 has a large opening 19 at least partly revealing the rear face 12 of the chip 6.

On a metallic front level produced on the front dielectric layer 17 there is formed a front electrical connection network 20, the parts of which are selectively linked, through the front dielectric layer 17, to the electrical bonding pads 9 of the chip 6 and to the electrical connection vias 16.

The front dielectric layer 17 and the electrical connection network 19 are covered with a dielectric layer 21 passed through by metallic elements 22, for example balls, to provide for external electrical connection of the device 1 for example to a printed circuit wafer (not represented).

On a metallic rear level produced on the rear dielectric layer 18 there are formed a metallic thermal transfer layer 23 which covers the revealed rear part 6a of the chip 6 and, at the periphery of and at a distance from this metallic layer 23, a rear electrical connection network 24, the parts of which are selectively linked, through the rear dielectric layer 18, to the electrical connection vias 16.

The rear dielectric layer 18, the metallic layer 23 and the rear electrical connection network 24 are covered with a dielectric layer 25 passed through by metallic elements 4, including metallic elements 4a placed on the metallic layer 23 and metallic elements 4b selectively linked to the rear electrical connection network 24.

The second component 3 comprises, stacked, a support wafer 26 that has a front face 27 facing and at a distance from the external face of the layer 25 of the first component 2, a first integrated circuit chip 28 fixed to a rear face 29 of the support wafer 26 via a layer of glue 30, a second integrated circuit chip 31 fixed to the first chip 28 via a layer of glue 32. The first chip 28 covers the central part of the surface of the support wafer 26 and the second chip 31 covers the central part of the surface of the first chip 28. The layers of glue 30 and 32 are made of a thermal material, suitable for transmitting heat.

In its central part situated beneath the first chip 28, the support wafer 26 has through holes 33 filled with a metallic material so as to form thermal vias 34 that go from one face to the other, the connection elements 4a being linked to the front faces of the thermal vias 34, suitable for transmitting heat.

In its peripheral part, the support wafer 26 comprises a front electrical connection network 35 from one face to the other, this network 35 being selectively linked, by pads provided on the front face 27 of the support wafer 26, to the connection elements 4b.

Between pads provided on the rear face of the first chip 28, around and at a distance from the periphery of the second chip 31, and pads of the electrical connection network 35 provided on the rear face of the support wafer 26, around and at a distance from the periphery of the first chip 28, there are provided electrical connection wires 36.

Between pads provided on the rear face of the second chip 31 and pads of the electrical connection network 35 provided on the rear face 29 of the support wafer 26, around and at a distance from the periphery of the first chip 28, there are provided electrical connection wires 37.

The second component 3 also comprises a dielectric encapsulation block 38 formed on the rear face 29 of the support wafer 26, in which the first and second chips 28 and 31 and the electrical connection wires 36 and 37 are embedded, the encapsulation block 38 being of parallelepipedal shape.

Thus, the first and second chips 28 and 31 can be selectively linked to the chip 6 of the first component 2 and/or to the external electrical connection elements 22.

The encapsulation block 38 of the second component 3 has an opening 39 provided above a central part 40 of the rear face of the second chip 31, inside the area of the pads linked to the electrical connection wires 37.

The second component 3 also comprises a thermal layer 41, for example metallic, which covers the central part 40 of the rear face of the second chip 31, the sides of the opening 39 of the encapsulation block 38 and at least partly the rear face 42 of the encapsulation block, around the opening 39.

The second component 3 also comprises an external thermal block 43 which at least partly covers the thermal layer 41 and the rear face 42 of the encapsulation block 38, the external thermal block 43 being formed, for example, by a thermal foam suitable for transmitting heat.

According to the example represented in FIG. 1, the external thermal block 43 completely covers the thermal layer 41 and the rear face 42 of the encapsulation block 38 and also extends against the upper part of the lateral sides of the encapsulation block 38.

According to an exemplary configuration, the chip 6 of the first component 2 may be heat generating when it is operating, whereas the chips 28 and 31 of the second component 3 do not generate, or generate little, heat when they are operating. However, one of the chips 28 and 31 or both could also be heat generating.

The result of the above is that the heat produced by the chip 6 of the first component 2 can be evacuated on the one hand by the front connection elements 22 and on the other hand via the second component 3, the components 2 and 3 being equipped for this purpose with specific means described above.

In addition to the connection elements 22, connection elements 22a, not connected to the connection network 20, can be added through the front layer 21 of the first component 2, in the area of the chip 6, to increase the quantity of heat that can be evacuated.

The heat emitted by the chip 6 of the first component 2 may be transmitted to the second component via the plurality of connection elements 4 and more particularly by the connections elements 4a placed on the metallic layer 23 spread over the chip 6.

In the second component 3, the heat deriving from the first component 2, in particular via the connection elements 4a, is diffused in the component 3, mainly, through the support wafer 26, in particular via the thermal vias 34 and the connection network 20 of the first component 2, then in the chips 28 and 31 and through the latter, then by the metallic layer 41 spread over the second chip 31, to be dissipated into the ambient air via the rear thermal block 43 and/or to be transferred to an internal or external wall of a package (see, FIGS. 1 and 2, element 100), for example a casing of a portable telephone, which would be in contact with an external face of the rear thermal block 43 (made of thermal foam as described above). The other parts of the second component 3 can also contribute to this thermal diffusion.

Figure 2:
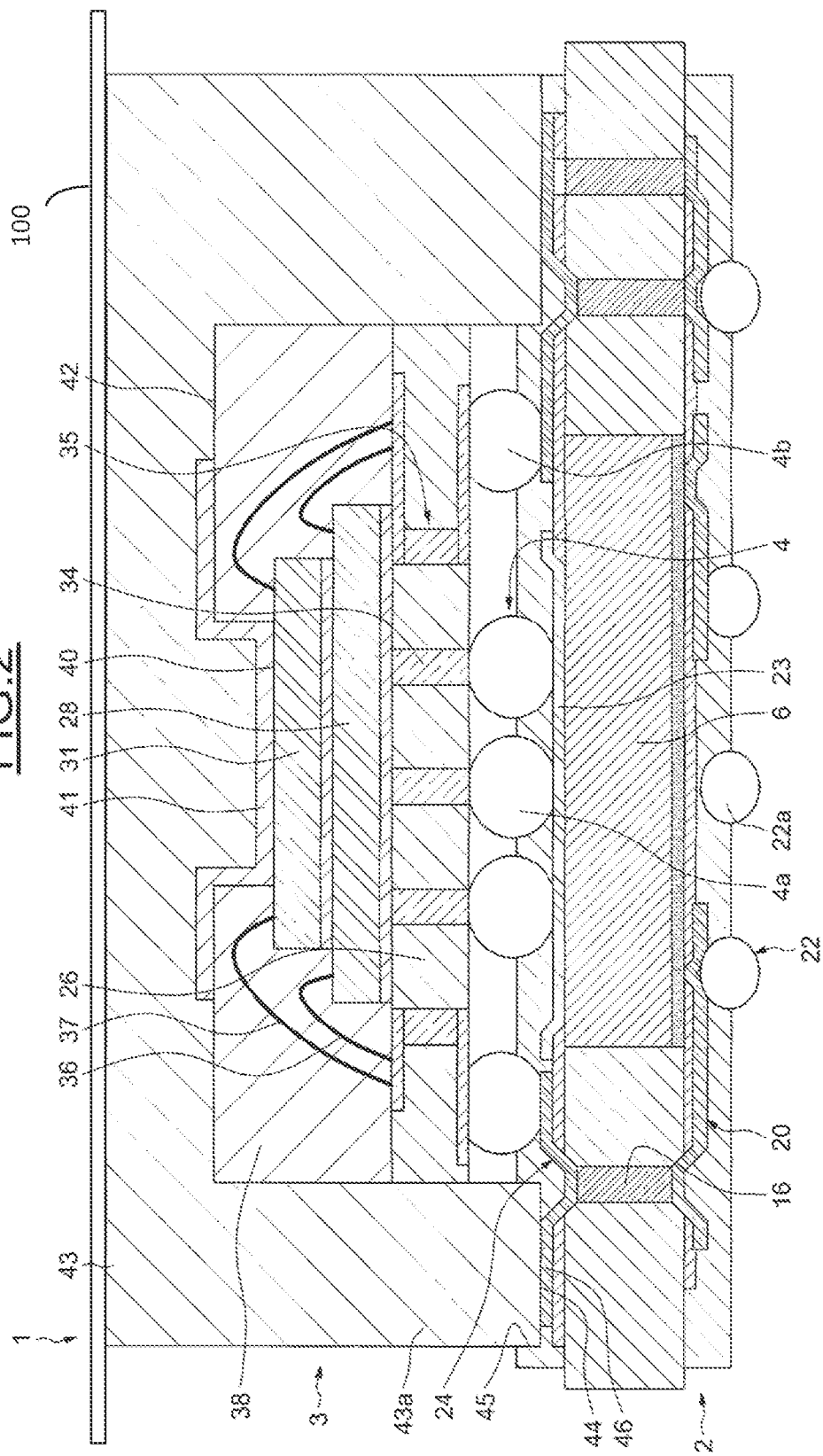
FIG. 2 represents, in cross section, a variant embodiment of the semiconductor device of FIG. 1.

Referring to FIG. 2, it can be seen that the second component 3 does not cover the first component 2 and that the thermal block 43 has sides 43a which extend against the lateral sides of the encapsulation block 38 and are extended so as to present end faces 44 in contact with the first component 2, at the periphery of the second component 3. According to the example represented, the layer 25 has one or more openings 45 into which penetrate the ends of the sides 43a so that the end faces 44 are in contact on metallic portions 46 of the connection network 20 and/or lateral extensions of the thermal transfer layer 23 of the first component 2.

Thus, the sides 43a of the thermal block 43 contribute to a direct dissipation of the heat produced by the chip 6.

The present invention is not limited to the examples described above. Many other variant embodiments are possible, without departing from the context defined by the appended claims.

What is claimed is:

1. A semiconductor device, comprising:
a first component comprising:
a slice including at least one first integrated circuit chip that has a front electrical connection face and a rear face, the slice further including an encapsulation block in which the first integrated circuit chip is peripherally embedded, and
a metallic thermal-only transfer layer at least partially in contact with the rear face of the first integrated circuit chip;
a second component situated behind and at a distance from the first component, wherein the second component comprises:
at least one second integrated circuit chip assembly;
a support wafer coupled to a rear face of the at least one second integrated circuit chip assembly; and
thermal-only connection vias passing through the support wafer and in thermal contact with the rear face of the at least one second integrated circuit chip assembly; and
a plurality of connection elements interposed between the first component and the second component, the connection elements including:
thermal-only connection elements in contact with the metallic thermal-only transfer layer of the first component and the thermal-only connection vias of the second component; and
electrical connection elements configured to form at least part of an electrical connection between the front electrical connection face of the first integrated circuit chip and the second component.

2. The device according to claim 1, wherein the first component comprises a front electrical connection network on the front face of the slice and a rear electrical connection network on the rear face of the slice, the front and rear electrical connection networks linked by electrical connection vias extending through said encapsulation block; and
wherein the second component comprises a front electrical connection network linked to the rear electrical connection network of the first component via said electrical connection elements.

3. The device according to claim 1, wherein the at least one second integrated circuit chip assembly comprises a top integrated circuit chip and a bottom integrated circuit chip, wherein a front face of the top chip is a front face of the at least one second integrated circuit chip assembly and a rear face of the bottom chip is the rear face of the at least one second integrated circuit chip assembly.

4. The device according to claim 1, wherein the second component comprises a metallic thermal-only rear layer at least partially in contact with a front face of said at least one second integrated circuit chip assembly.

5. The device according to claim 4, wherein the second component further comprises an external thermal block in contact with and extending at least partially over said metallic thermal-only rear layer.

6. The device according to claim 5, wherein the external thermal block extends over the rear face of the second component and has a lateral part which extends surrounding sides of the second component.

7. The device according to claim 6, wherein the lateral part of the external thermal block is in thermal contact with a peripheral part of the rear face of the first component.

8. The device according to claim 7, wherein the first component comprises a front electrical connection network on the front face of the slice and a rear electrical connection network on the rear face of the slice, the front and rear electrical connection networks linked by electrical connection vias extending through said encapsulation block; and
wherein said peripheral part of the rear face of the first component comprises one of: metallic portions of the rear electrical connection network, or lateral extensions of the metallic thermal transfer layer.

9. Apparatus, comprising:
a heat sink element; and
a semiconductor device thermally coupled to the heat sink element, the semiconductor device comprising:
a first component comprising:
a slice including at least one first integrated circuit chip that has a front electrical connection face and a rear face, the slice further including an encapsulation block in which the first integrated circuit chip is peripherally embedded, and
a metallic thermal-only transfer layer at least partially in contact with the rear face of the first integrated circuit chip;
a second component situated behind and at a distance from the first component wherein the second component comprises:
at least one second integrated circuit chip assembly;
a support wafer coupled to a rear face of the at least one second integrated circuit chip assembly; and
thermal-only connection vias passing through the support wafer and in thermal contact with the rear face of the at least one second integrated circuit chip assembly; and
a plurality of connection elements interposed between the first component and the second component, the connection elements including:
thermal-only connection elements in contact with the metallic thermal-only transfer layer of the first component and the thermal-only connection vias of the second component; and
electrical connection elements configured to form at least part of an electrical connection between the front electrical connection face of the first integrated circuit chip and the second component;
wherein said metallic thermal-only transfer layer is thermally linked to the heat sink element of the apparatus via a thermal block.

10. A semiconductor device, comprising:
a first component comprising:
a first integrated circuit chip having a front electrical connection face and a rear face;
an encapsulation block peripherally embedding the first integrated circuit chip;
front electrical connection means in contact with the front electrical connection face of the first integrated circuit chip;
first electrical connection vias passing through the encapsulation block; and
a metallic thermal-only transfer layer in contact with the rear face of the first integrated circuit chip;
a second component, comprising:
a second integrated circuit chip assembly having a front electrical connection face and a rear face;

a support wafer attached to the rear face of the second integrated circuit chip assembly;

thermal-only vias passing through the support wafer and in contact with the rear face of the second integrated circuit chip assembly;

second electrical connection vias passing through the support wafer; and front electrical connection means in electrical contact with the front electrical connection face of the second integrated circuit chip assembly and the second electrical connection vias; and intercomponent thermal-only connections thermally connecting the thermal-only vias to the metallic thermal-only transfer layer; and intercomponent electrical connections electrically connecting the second electrical connection vias to the first electrical connection vias.

11. The semiconductor device of claim 10, wherein the second integrated circuit chip assembly comprises a top integrated circuit chip and a bottom integrated circuit chip, wherein the top integrated circuit chip has a front electrical connection face and a rear face, wherein the rear face of the top integrated circuit chip is attached to a front electrical connection face of the bottom integrated circuit chip.

12. The semiconductor device of claim 11, wherein the second component further comprises additional front electrical connection means in contact with the front electrical connection face of the top integrated circuit chip and the second electrical connection vias.

13. The semiconductor device of claim 11, wherein the second component further comprises:

a metallic thermal-only transfer layer in contact with the front electrical connection face of the top integrated circuit chip; and a thermal block in contact with the metallic thermal-only transfer layer.

14. The semiconductor device of claim 13, wherein the thermal block is made of thermal foam.

15. The semiconductor device of claim 10, wherein:

the second semiconductor chip assembly comprises a single integrated circuit chip; and the second component further comprises:

a metallic thermal-only transfer layer configured to conduct thermal energy away from a front electrical connection face of the single integrated circuit chip; and a thermal block in contact with the metallic thermal-only transfer layer.

16. The semiconductor device of claim 15, wherein the thermal block is further in thermal connection with the first electrical connection vias passing through the encapsulation block of the first component.

17. The device according to claim 1, wherein the front and rear faces of the first integrated circuit chip and the front and rear faces of the encapsulation block are co-planar to form front and rear faces of the slice.

18. The device according to claim 3, wherein a front face of the bottom integrated circuit chip is coupled to a rear face of the top integrated circuit chip.

19. The apparatus according to claim 9, wherein the front and rear faces of the first integrated circuit chip and the front and rear faces of the encapsulation block are co-planar to form front and rear faces of the slice.

* * * * *